United States Patent [19]

Toyoda et al.

[11] Patent Number: 5,083,221

[45] Date of Patent: Jan. 21, 1992

[54] OPTICAL UNIT HAVING MEANS FOR ELECTRICALLY SHIELDING ELECTROOPTICAL

[75] Inventors: Shuhei Toyoda, Nagoya; Soichiro Matsuzawa, Kuwana; Masahiro Ichinose, Kasugai, all of Japan

[73] Assignee: NGK Insulators, Ltd., Aichi, Japan

[21] Appl. No.: 433,457

[22] Filed: Nov. 9, 1989

Related U.S. Application Data

[63] Continuation of Ser. No. 172,379, Mar. 24, 1988, abandoned.

[30] Foreign Application Priority Data

Mar. 27, 1987 [JP] Japan .................................. 62-75530

[51] Int. Cl.$^5$ .......................... G02F 1/03; G02F 1/07; H01L 23/02
[52] U.S. Cl. .................... 359/245; 359/254; 359/251; 359/276; 357/74
[58] Field of Search ...................... 350/355, 356, 374; 427/126.5, 163; 356/368; 174/52.5, 51, 50.59, 50.51; 361/390; 357/74

[56] References Cited

U.S. PATENT DOCUMENTS

| | | | |
|---|---|---|---|
| 2,868,862 | 1/1959 | Petri | 174/52.5 |
| 3,362,002 | 1/1968 | Sedlak et al. | 336/87 |
| 3,823,998 | 7/1974 | Yazaki et al. | 350/355 X |
| 4,204,742 | 5/1980 | Johnson et al. | 350/96.29 |
| 4,218,578 | 8/1980 | Olschewski et al. | 174/51 |
| 4,428,873 | 1/1984 | Murayama et al. | 350/355 X |
| 4,563,093 | 1/1986 | Tada et al. | 356/368 |
| 4,608,535 | 8/1986 | Tada et al. | 350/374 X |
| 4,706,106 | 11/1987 | Shiba et al. | 174/52.5 |

FOREIGN PATENT DOCUMENTS

| | | |
|---|---|---|
| 0081367 | 6/1983 | European Pat. Off. . |
| 0083196 | 7/1983 | European Pat. Off. . |
| 62-293168 | 12/1987 | Japan . |
| 2058506 | 4/1981 | United Kingdom ............... 174/52.5 |

OTHER PUBLICATIONS

Dreyfus et al., "Gaseous Transparent Electrode Device", *IBM Technical Disclosure Bulletin*, vol. 11, No. 6, Nov. 1968.
T. Mitsui et al., "Development of Fiber-Optic Voltage Sensors and Magnetic-Field Sensors", 1986 IEEE.
Y. Ohno; "Design and Application of Fiber-Optic Electric Field Sensors for High Voltage Electric Systems" 1984, Nippon University, Dept of Science and Eng., Japan.
*Journal of Physics E Scientific Instruments*, Jun. 1985, vol. 18, No. 6, pp. 453-544, "Capcitively Coupled KD*P Pockets Cell for High voltage Pulse Measurements", Primary Examiner—Eugene R. Laroche
Assistant Examiner—Evelyn A. Lester
Attorney, Agent, or Firm—Parkhurst, Wendel & Rossi

[57] ABSTRACT

An optical unit having an electrooptical element whose optical properties are changed as a function of a voltage applied thereto to modulate an incident light in response to the applied voltage. The optical unit includes a shielding member for electrically shielding at least a portion thereof which includes the electrooptical element from an external electric field. The shielding member protects the electrooptical element from an influence of an external electric field on an electrooptical effect of the electrooptical element. The shielding member may be an electrically conductive member, such as a metallic casing accommodating the electrooptical element, or an electrically conductive layer covering a housing accommodating the element.

9 Claims, 3 Drawing Sheets

OPTICAL UNIT HAVING MEANS FOR ELECTRICALLY SHIELDING ELECTROOPTICAL

This is a continuation of application Ser. No. 172,379, filed Mar. 24, 1988, now abandoned.

BACKGROUND OF THE INVENTION

1. Field of the Invention

The present invention relates in general to an optical device, in particular, an optical voltage sensor or optical modulator utilizing a light beam in particular, and more specifically to an optical unit or component used for such a voltage sensor or modulator which utilizes an electrooptical effect.

2. Discussion of the Prior Art

An optical device utilizing an electrooptical effect is known. The device includes an optical unit which uses, as an electrooptical element, a Pockel's element such as a single crystal of $LiNbO_3$ (lithium niobate) or $Bi_{12}SiO_{20}$. The electrooptical or Pockel's element is provided with a pair of electrodes. In operation, a voltage is applied between the electrodes to produce an electric field so that the electrooptical element is placed in the electric field. On the other hand, the optical unit receives a light beam transmitted through a suitable optical path such as an optical fiber. The incident light beam is linearly polarized by a polarizer, and the phase of the linearly polarized light beam incident upon the electrooptical element is modulated, depending upon the intensity of the electric field in which the element is placed. A change in the phase of the light beam is converted by an analyzer into a change in the intensity of the light beam emitted from the analyzer. The thus changed intensity of the light beam from the analyzer is sensed by a light detector such as a photodiode.

As described above, the electrooptical element used in the optical unit utilizing an electrooptical element is exposed to an electric field produced by a voltage applied between the electrodes. However, an electrooptical effect achieved by the electrooptical element is influenced by an external electric field other than the electric field produced by the voltage applied between the electrodes. Accordingly, the quantity or intensity of the light beam to be detected by the optical unit is undesirably varied due to the external electric field.

SUMMARY OF THE INVENTION

The present invention was developed in the light of the prior art situation described above. It is therefore an object of the present invention to provide an optical unit wherein optical properties of an electrooptical element are not influenced by an external electric field.

The above object can be attained according to the principle of the present invention, which provides an optical unit wherein an incident light beam is modulated according to an applied voltage, comprising an electrooptical element and electrically shielding means. The electrooptical element is adapted to receive the incident light. The optical properties of the element are changed as a function of a voltage applied thereto, whereby the incident light is modulated in response to the applied voltage. The electrically shielding means electrically shields at least the electrooptical element from an external electric field.

In the optical unit of the present invention constructed as described above, the shielding means for electrically shielding a portion of the optical unit including the electrooptical element functions to protect the electrooptical element from an external electric field as caused by static electricity, thereby preventing an adverse influence of the external electric field on the electrooptical effect of the electrooptical element. Accordingly, the accuracy of detecting a voltage applied to the electrooptical element, or the accuracy of optical modulation by the element can be significantly improved. This is an important industrial significance of the present invention.

In one form of the present invention, the shielding means consists of an electrically conductive member, which may be electrically connected to one of a pair of electrodes provided on the electrooptical element, or grounded to the earth.

The electrically conductive member may be an electrically conductive layer formed over the substantially entire surface of a housing which accommodates at least the electrooptical element. This layer may consist of a coating of an electrically conductive material (paint). Alternatively, the electrically conductive member may consists of a casing which accommodates at least the electrooptical element and which is formed of a metal conductor.

The optical unit according to the invention may be used as part of an optical voltage sensor for detecting a voltage applied to the electrooptical element, based on a change in the optical properties of the electrooptical element due to the applied voltage, for example, based on a change in the intensity of the light beam as a result of the electrooptical effect. The instant optical unit may also be used as part of an optical modulator for modulating a characteristic of the light beam as a function of the voltage applied to the electrooptical element.

BRIEF DESCRIPTION OF THE DRAWINGS

The above and other objects, features and advantages of the present invention will be better understood by reading the following detailed description of presently preferred embodiments of the invention, when taken in connection with the accompanying drawings, in which.

DETAILED DESCRIPTION OF THE PREFERRED EMBODIMENTS

To further clarify the concept of the present invention, several presently preferred embodiments of the invention will be described in detail by reference to the drawings. It is to be understood that the invention is not limited to the details of the illustrated embodiments.

It is evident that various changes, modifications and improvements which may occur to those skilled in the art may be made in the invention, without departing from the spirit of the invention. Accordingly, it is intended that all such changes, modifications and improvements fall within the scope of the invention.

Figure 1:
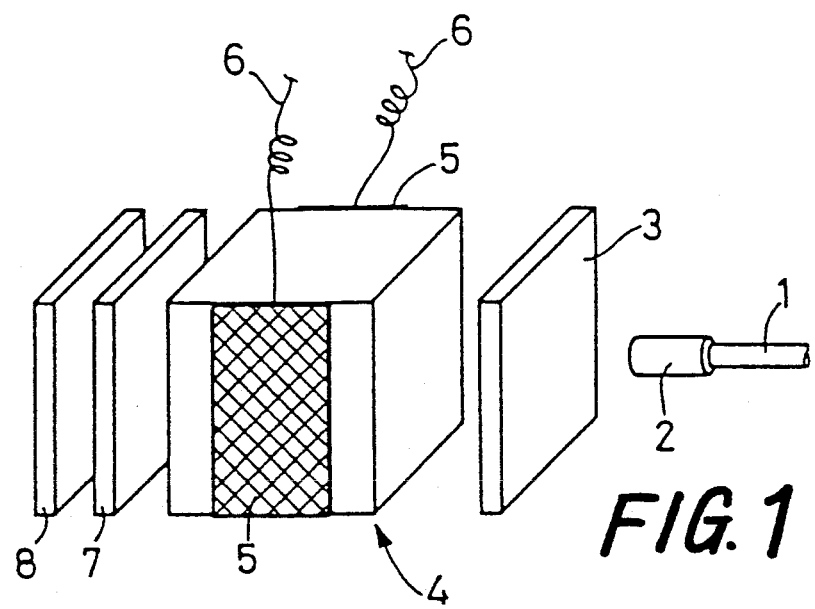
FIGS. 1 and 2 are perspective views showing an arrangement of main body portions of different types of optical voltage sensors, respectively.
Figure 2:
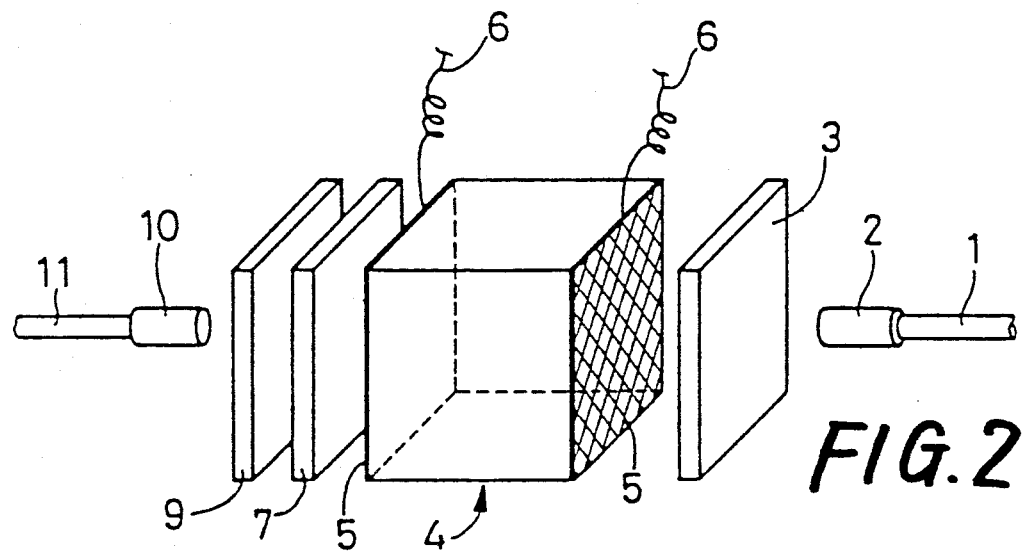
Figure 3:
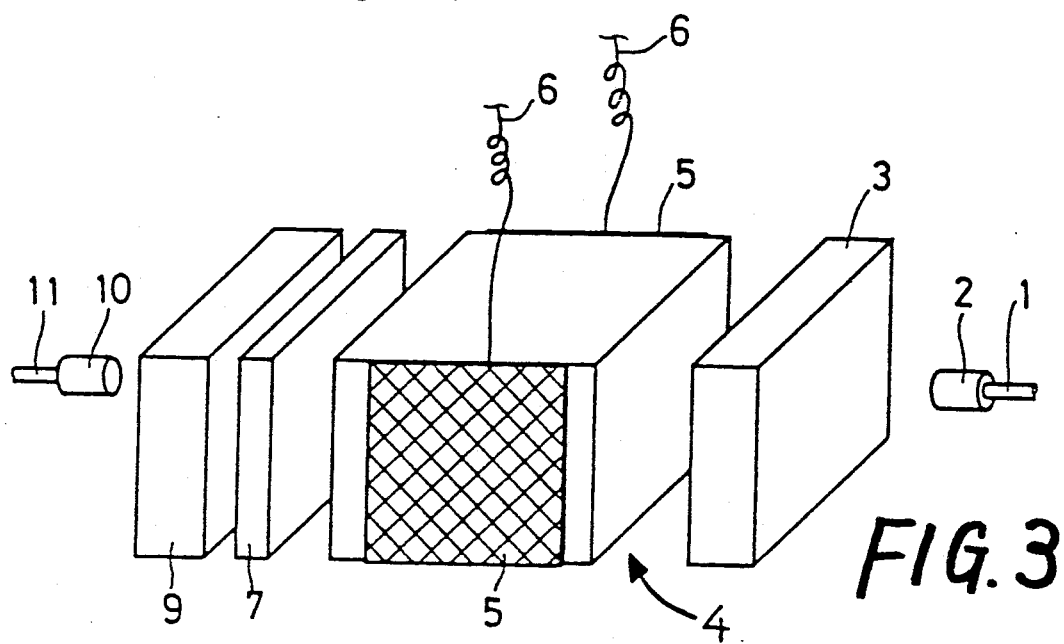
FIG. 3 is a perspective view showing an arrangement of an optical modulator.

There are shown in FIGS. 1 and 2 optical units which are main body portions of optical voltage sensors of light-reflecting and light-transmitting types, respectively. Referring further to FIG. 3, there is shown another optical unit which is a main body portion of an optical modulator. In these figures, reference numeral 1 designates an optical path in the form of an optical fiber for transmitting a light beam from a light source or light transmitter (not shown) to the main body portion of the appropriate optical voltage sensor or modulator. The light beam transmitted through the optical fiber 1 is incident upon a polarizer 3 through a rod lens 2, so that the incident light is linearly polarized by the polarizer 3. The linearly polarized light beam is then received by an electrooptical element 4 formed of an electrooptical material.

The electrooptical element 4 is a Pockel's element consisting of a single crystal of $LiNbO_3$ (lithium niobate), $LiTaO_3$ (lithium tantalate), $Bi_{12}SiO_{20}$, or $Bi_{12}GeO_{20}$, for example. The incident light beam is elliptically polarized by the electrooptical element 4, such that the ellipticity of the elliptically polarized light beam which has passed through the element 4 varies as a function of an electric voltage applied to the element 4. In the optical voltage sensor shown in FIG. 1, a pair of electrodes 5, 5 are formed on opposed faces of the crystal of the electrooptical element 4 which are parallel to the direction of propagation of the light beam. The voltage to be measured is applied between these electrodes 5, 5 via respective lead wires 6, 6. In the optical voltage sensor shown in FIG. 2, the two electrodes 5, 5 are disposed on opposed faces of the electrooptical crystal element 4 which are normal to the direction of propagation of the light beam, so that the voltage is applied between the electrodes 5, 5. In the optical modulator shown in FIG. 3, the electrodes 5, 5, are disposed on opposed faces of the crystal element 4 parallel to the direction of propagation of the light beam, so that a voltage signal is applied between the electrodes 5, 5.

In the optical voltage sensor of the light-reflecting type of FIG. 1, the elliptically polarized light beam emitted from the electrooptical element 4 is passed through a quarter ($\lambda/4$) waveplate 7, and is reflected by a reflector mirror 8. The reflected light beam is transmitted through the quarter waveplate 7 and electrooptical element 4, and through the polarizer 3 which also serves as an analyzer. Thus, the intensity of the reflected light beam which has passed the analyzer 3 varies depending upon the ellipticity of the elliptically polarized light beam emitted from the electrooptical element 4. The light beam from the analyzer 3 is transmitted through the rod lens 2 and optical fiber 1, to a light detector (not shown) via an optical coupler provided in the optical fiber 1, so that the intensity of the light beam is sensed by the light detector. Consequently, the voltage to be measured (voltage applied between the electrodes 5, 5 of the electrooptical element 4) can be measured depending upon the sensed intensity of the light beam.

In the optical voltage sensor of the light-transmitting type of FIG. 2, the light beam elliptically polarized by the electrooptical element 4 is transmitted to an analyzer 9 via the quarter waveplate 7, and the intensity of the light beam which has passed through the analyzer 9 varied depending upon the ellipticity of the elliptically polarized light from the element 4, as in the optical voltage sensor of FIG. 1. The light beam from the analyzer 9 is transmitted through a rod lens 10 and an optical fiber 11 to a light detector (not shown), by which the voltage to be measured is detected depending upon the intensity of the light received. In the optical modulator of FIG. 3, the intensity of the light beam which travels through the electrooptical element 4 varies with an level of the voltage signal applied to the element 4. The thus modulated intensity of the light beam is transmitted through the optical fiber 11 and is detected by a light detector (not shown). An output of the light detector is changed with the detected intensity of the light beam.

The principle of the present invention is applicable to optical units or components which include an optical element or component such as the electrooptical elements 4 shown in FIGS. 1, 2 and 3. Described more specifically, the present invention provides suitable electrically shielding means as illustrated in FIGS. 4 through 8, for enclosing at least the electrooptical element 4 of an optical unit with ah electrically conductive material, and thereby protecting the electrooptical element 4 from an external electric field, which may have an adverse influence on the electrooptical effect of the element 4. By "electrooptical effect" is meant a phenomenon wherein the optical properties of an electrooptical crystal are changed with a magnitude of an electric field applied to the crystal, i.e., as a function of a voltage applied to the crystal.

Figure 4:
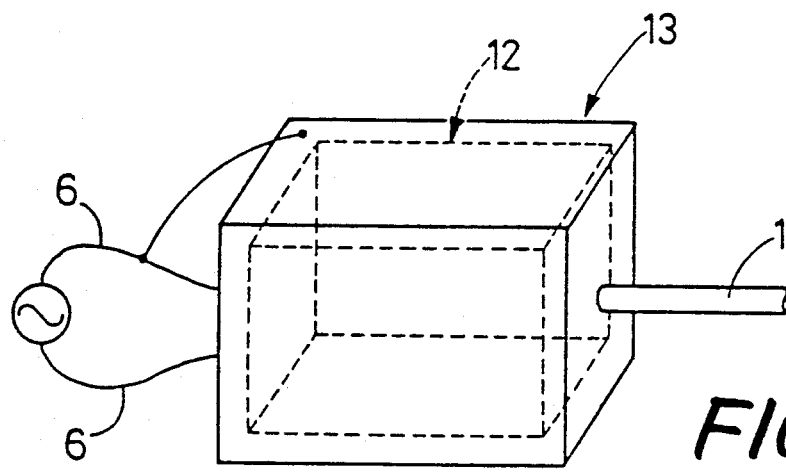
FIGS. 4-8 are schematic views illustrating different forms of an optical voltage sensor constructed according to the present invention.

In a first embodiment of the present invention shown in FIG. 4, a main body portion 12 of the light-reflecting type optical voltage sensor of FIG. 1 (including rod lens 2, polarizer/analyzer 3, electrooptical element 4, waveplate 7 and mirror 8) is fluid-tightly contained in an electrically conductive member in the form of a metallic casing 13 which is formed from an electrically conductive metal plate or sheet, such as a copper plate. This metallic casing 13 is electrically connected to one of the lead wires 6, 6 which are connected to the electrodes 5, 5.

Figure 5:
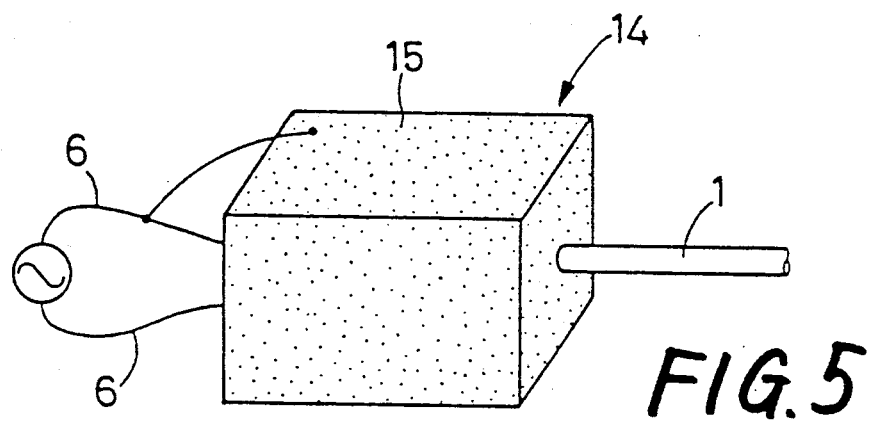

In a second embodiment of the invention shown in FIG. 5, a housing 14 which fluidly-tightly contains the main body portion of the light-reflecting type optical voltage sensor as shown in FIG. 1 is covered by an electrically conductive member in the form of a layer 15, which is formed over the substantially entire surface area of the housing. The electrically conductive layer 15 electrically shields the main body portion of the sensor from an external electric field.

The electrically conductive layer 15 may be formed with a suitable thickness on the outer surface of the housing 14, for example, by deposition of a powdered metal or carbon or a powder of other electrically conductive material in a known manner, or by bonding an electrically conductive plate or sheet such as a metal foil, or alternatively by plating of an electrically conductive material. Preferably, the layer 15 may be formed by coating the outer surface of the housing 14 with an electrically conductive paint which contains the selected electrically conductive material indicated above.

The electrically conductive layer 15 is electrically connected to one of the lead wires 6, 6 connected to the electrodes 5, 5 of the electrooptical element 4 accommodated within the housing 14.

Figure 6:
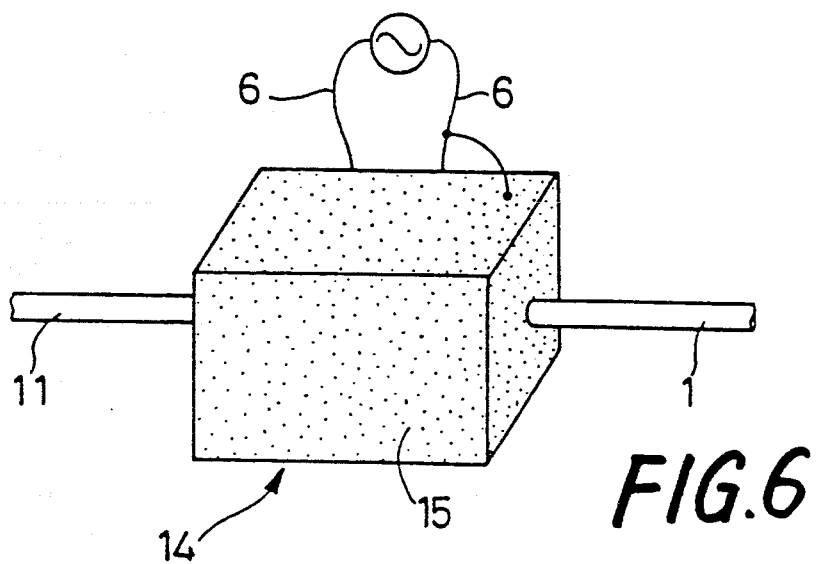

Referring to FIG. 6, there is shown a third embodiment of the present invention as applied to a light-transmitting type optical voltage sensor as shown in FIG. 2. In this embodiment, an electrically conductive member in the form of the electrically conductive layer 15 as used in the preceding embodiment of FIG. 5 covers the entire surface of the housing 14 in which is fluid-tightly contained the main body portion of the voltage sensor (which includes rod lens 2, polarizer 3, electrooptical element 4, waveplate 7, analyzer 9 and output-side rod lens 10). The layer 15 is electrically connected to one of the lead wires 6, as in the preceding embodiments.

In all of the illustrated embodiments described above, all the components of the main body portion (12) of the voltage sensors are accommodated or contained in the housing 14 enclosed or covered by the electrically conductive casing 13 or layer 15, so that these components are electrically shielded from an external electric field. However, the principle of the instant invention is applicable to a part of the main body portion which includes at least the electrooptical element 4. Namely, the invention may be practiced, provided at least the electrooptical element 4 is enclosed by a suitable electrically conductive member and is therefore protected from the external electric field.

With the electrically conductive member provided according to the invention so as to shield at least the electrooptical element 4 of the optical voltage sensor or other device from the external electric field, the electrooptical effect achieved by the element 4 is determined solely by the electric field which is produced by the voltage applied between the electrodes 5, 5. Accordingly, the voltage or voltage signal level applied to the optical device or unit can be accurately detected, based on the electrooptical effect of the element 4 which is protected from an influence by any externally existing electric field.

Figure 7:
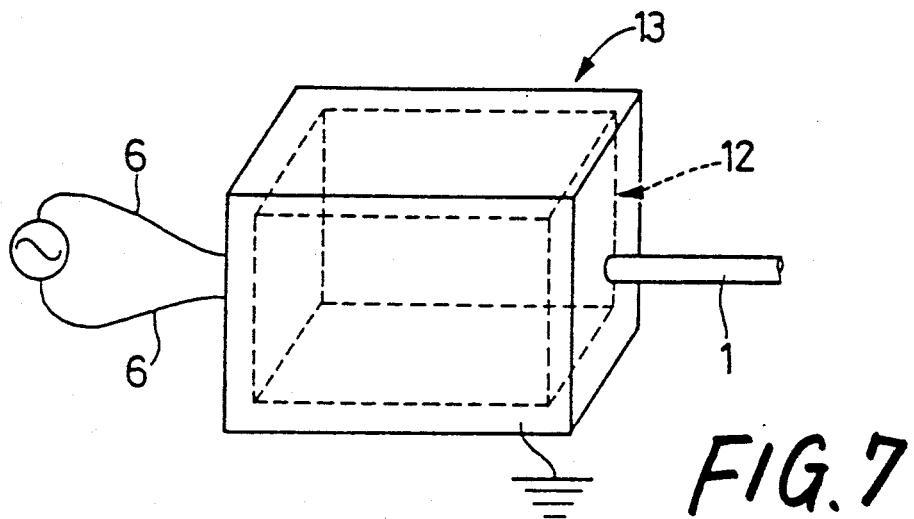
Figure 8:
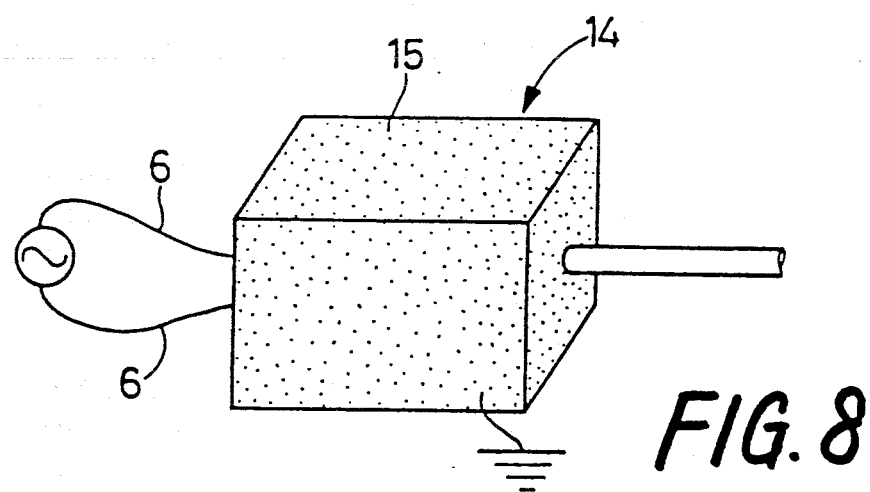

While the electrically conductive member (13, 15) used in the embodiments of FIGS. 4–6 is connected to one of the lead wires or lugs 6 connected to the electrodes 5, the conductive member (13,15) may be grounded as shown in FIGS. 7 and 8, which correspond to FIGS. 4 and 5, respectively. The electrical connection of the conductive member to the lead wire 6 or to the ground permits more effective electric shielding of the electrooptical element 4 from external electric fields.

The effect of the electrically shielding member provided according to the present invention will become more apparent from the following tests conducted on the samples constructed as illustrated above:

EXAMPLE 1

The optical voltage sensor of the light-reflecting type as shown in FIG. 1 was prepared, by using a $LiNbO_3$ single crystal having dimensions of 2 mm×4 mm×5 mm, which has the electrodes (5) on the 4 mm×5 mm faces which are parallel to the Z axis which is parallel to the direction of propagation of the light beam. The reflected light beam as an output of the main body portion of the sensor is received by a photodiode of a light detector. To reduce the signal transmission loss and improve the measuring accuracy of the sensor, an arithmetic circuit was used to separate a voltage output of the photodiode into AC and DC components, and electrically dividing the AC component by the DC component, so that a signal indicative of the quotient is obtained as a detector output. In the test, AC50 V, 60 Hz was applied to the electrooptical element (4) of the voltage sensor, and a measurement of the detector output was 500 mV.

In the same test condition as indicated above, the main body portion of the voltage sensor was subjected to external static electric fields of different magnitudes as indicated in Table 1. The electric fields were produced in a direction perpendicular to the surfaces of the electrodes (5), i.e., perpendicular to the direction of propagation of the light beam. Measurements of the detector output are indicated also in Table 1.

TABLE 1

| Electric Field (V/cm) | Detector Output (mV) |
|---|---|
| 0 | 500.0 |
| 250 | 499.6 |
| 500 | 499.3 |
| 700 | 499.0 |
| 1000 | 498.5 |

The voltage sensor was electrically shielded as shown in FIG. 4. Described more specifically, the main body portion (12) of the voltage sensor was fluid-tightly accommodated in or enclosed by the casing (13) made from a copper plate. One of the lead wires 6 was electrically connected to the copper casing (13). AC50 V, 60 Hz was applied to the sensor while the magnitude of the external static electric field was changed as indicated in Table 1. The test revealed no variation in the detector output due to changes in the magnitude of the external electric field.

Further, the copper casing (13) was replaced by the electrically conductive layer (15) as shown in FIG. 5, which covers the housing 14 of the sensor package. The layer (15) is formed of an electrically conductive coating of a suitable thickness consisting of an epoxy resin mixed with silver. An AC50 V, 60 Hz signal was applied to the sensor while the magnitude of the external static electric field was changed as indicated above. The test revealed no variation in the detector output depending upon the varying magnitude of the external electric field.

EXAMPLE 2

The optical voltage sensor of the light-transmitting type as shown in FIG. 2 was prepared, by using a $Bi_{12}SiO_{20}$ single crystal having dimensions of 4 mm×7 mm×5 mm, which has the transparent electrodes (5) on the 7 mm×5 mm faces which are normal to the direction of propagation of the light beam. The light detector as used in Example 1 was used. In the test, an AC100 V, 60 Hz signal was applied to the electrooptical element (4) of the voltage sensor, and a measurement of the detector output was 1.50 V.

In the same test condition as indicated above, the main body portion of the voltage sensor was subjected to external static electric fields of different magnitudes as indicated in Table 2. The electric fields were produced in a direction perpendicular to the surfaces of the electrodes (5), i.e., parallel to the direction of propagation of the light beam. Measurements of the detector output are indicated also in Table 2.

TABLE 2

| Electric Field (V/cm) | Detector Output (V) |
|---|---|
| 0 | 1.50 |
| 500 | 1.43 |
| 1000 | 1.35 |

The voltage sensor was electrically shielded in a manner as shown in FIG. 6. However, the housing (14) covered by the copper layer (15) to accommodate the main body portion of the sensor was replaced by the casing (13) formed of a 100-micron thick copper plate, as shown in FIG. 4. One of the lead wires (6) was electrically connected to the casing (13).

The test was conducted on the thus shielded voltage sensor in the same manner as described above. The test revealed no variation in the detector output due to changes in the magnitude of the external static electric field to which the sensor was exposed.

What is claimed is:

1. An optical unit comprising:

an electrooptical element which receives an incident light beam and has a pair of electrodes disposed on opposing faces thereof, and whose optical properties are changed as a function of a voltage applied between said pair of electrodes, whereby said incident light beam transmitted through said electrooptical element is influenced in response to said applied voltage;

a covering member for accommodating therein at least said electrooptical element, so as to permit said incident light beam to be incident upon said electrooptical element; and shielding means for electrically shielding at least said electrooptical element from an external electric field, said shielding means comprising an electrically conductive member formed separate from said covering member and said electrooptical element, said shielding means being disposed outside said covering member and accommodating therein said covering member and said electrooptical element, said shielding means being electrically connected to one of said pair of electrodes or grounded.

2. An optical unit according to claim 1, further comprising a pair of lead wires connected to said pair of electrodes for applying said voltage between said pair of electrodes, said electrically conductive member being connected to one lead wire of said pair of lead wires.

3. An optical unit according to claim 1, wherein said electrically conductive member is formed on said covering member.

4. An optical unit according to claim 3, wherein said electrically conductive member comprises an electrically conductive layer which covers said covering member.

5. An optical unit according to claim 4, wherein said electrically conductive layer comprises a coating of an electrically conductive material formed on said covering member.

6. An optical unit according to claim 1, further comprising an optical voltage sensor comprising said electrooptical element, said voltage sensor detecting said voltage applied to said electrooptical element based on a change in the optical properties of said electrooptical element due to said voltage.

7. An optical unit according to claim 2, further comprising an optical modulator comprising said electrooptical element, said optical modulator modulating a characteristic of said light beam as a function of said voltage applied to said electrooptical element.

8. An optical unit according to claim 1, further comprising polarizer means for linearly polarizing said incident light beam, and an analyzer, wherein said electrooptical element elliptically polarizes the linearly polarized light beam from said polarizer, said analyzer receives the elliptically polarized light beam from said electrooptical element, and changes a quantity of the light beam which has passed therethrough.

9. An optical unit according to claim 8, wherein said shielding means electrically shields at least said polarizer, said analyzer, and said electrooptical element.

* * * * *

UNITED STATES PATENT AND TRADEMARK OFFICE
CERTIFICATE OF CORRECTION

PATENT NO. : 5,083,221

DATED : January 21, 1992

INVENTOR(S) : Shuhei Toyoda, et al

It is certified that error appears in the above-identified patent and that said Letters Patent is hereby corrected as shown below:

On title page, item [54] and column 1, lines 1 - 2, change, "OPTICAL UNIT HAVING MEANS FOR ELECTRICALLY SHIELDING ELECTROOPTICAL" to --OPTICAL UNIT HAVING MEANS FOR ELECTRICALLY SHIELDING ELECTROOPTICAL ELEMENT--.

Signed and Sealed this

Thirtieth Day of March, 1993

*Attest:*

STEPHEN G. KUNIN

*Attesting Officer*     *Acting Commissioner of Patents and Trademarks*